US012412619B2

(12) United States Patent
Shin et al.

(10) Patent No.: US 12,412,619 B2
(45) Date of Patent: Sep. 9, 2025

(54) APPARATUSES AND METHODS FOR ROW DECODER WITH MULTIPLE SECTION ENABLE SIGNAL VOLTAGE DOMAINS

(71) Applicant: MICRON TECHNOLOGY, INC., Boise, ID (US)

(72) Inventors: Sang Hoon Shin, Boise, ID (US); Sang-Kyun Park, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 17/709,753

(22) Filed: Mar. 31, 2022

(65) Prior Publication Data

US 2023/0317141 A1  Oct. 5, 2023

(51) Int. Cl.
  *G11C 11/408* (2006.01)
  *G11C 11/4074* (2006.01)
  *G11C 11/4093* (2006.01)

(52) U.S. Cl.
  CPC ...... *G11C 11/4087* (2013.01); *G11C 11/4074* (2013.01); *G11C 11/4085* (2013.01); *G11C 11/4093* (2013.01)

(58) Field of Classification Search
  CPC ............ G11C 11/4087; G11C 11/4074; G11C 11/4085; G11C 11/4093; G11C 16/08; G11C 7/1051; G11C 7/1078; G11C 16/24
  USPC .................................................. 365/230.06
  See application file for complete search history.

(56) References Cited

U.S. PATENT DOCUMENTS

| 10,872,654 B1 * | 12/2020 | Lee | G11C 11/4085 |
| 2010/0278003 A1 * | 11/2010 | Bollu | G11C 8/10 |
| | | | 365/230.06 |
| 2020/0194051 A1 * | 6/2020 | Takayama | G11C 7/1096 |
| 2020/0327916 A1 * | 10/2020 | Suzuki | G11C 8/14 |
| 2021/0050042 A1 * | 2/2021 | Lam | G11C 8/18 |
| 2022/0230667 A1 * | 7/2022 | Jung | G11C 8/08 |

FOREIGN PATENT DOCUMENTS

| CN | 109074833 A | * 12/2018 | ........... G11C 11/419 |
| CN | 113140243 A | * 7/2021 | ........... G11C 11/406 |
| CN | 113707199 A | * 11/2021 | ......... G06F 13/1668 |

(Continued)

OTHER PUBLICATIONS

CN-113140243-A (Year: 2021).*

(Continued)

*Primary Examiner* — Fernando Hidalgo
(74) *Attorney, Agent, or Firm* — Dorsey & Whitney LLP

(57) ABSTRACT

Apparatuses, systems, and methods for a row decoder with multiple section enable signal voltage domains. A row address is decoded into a pre-enable signal. A first section enable signal and a second section enable signal are generated based on the pre-enable signal. The first section enable signal is in a first voltage domain where a first voltage represents an logical high, the second section enable signal is in a second voltage domain where a second voltage represents a logical high, and the pre-enable signal is in a third voltage domain where a third voltage represents a logical high. The second voltage is between the first and third voltages. A word line driver signal is generated based on the first and the second section enable signals.

20 Claims, 5 Drawing Sheets

(56) References Cited

FOREIGN PATENT DOCUMENTS

JP 2022035525 A * 3/2022 ............. G11C 16/10
KR 2000-0076795 A * 12/2000 .......... E04F 13/0853

OTHER PUBLICATIONS

CN-109074833-A (Year: 2018).*
CN-113707199-A (Year: 2021).*
JP-2022035525 (Year: 2022).*
KR-20000076795-A (Year: 2000).*

* cited by examiner

APPARATUSES AND METHODS FOR ROW DECODER WITH MULTIPLE SECTION ENABLE SIGNAL VOLTAGE DOMAINS

BACKGROUND

This disclosure relates generally to semiconductor devices, and more specifically to semiconductor memory devices. In particular, the disclosure relates to volatile memory, such as dynamic random access memory (DRAM). The memory may have a number of memory cells, each of which stores a bit of information (e.g., as a physical signal, such as a capacitive charge). The memory cells may be organized into an array, with each memory cell at the intersection of a row (e.g., word line) and column (e.g., a bit line). Row and column addresses may be used to specify one or more memory cells. A row decoder receives the row address and activates the row (e.g., by providing a voltage to the word line associated with the row address). As memory devices decrease in size, there may be a need to reduce the size of components, such as the row decoder.

DETAILED DESCRIPTION

Figure 1:
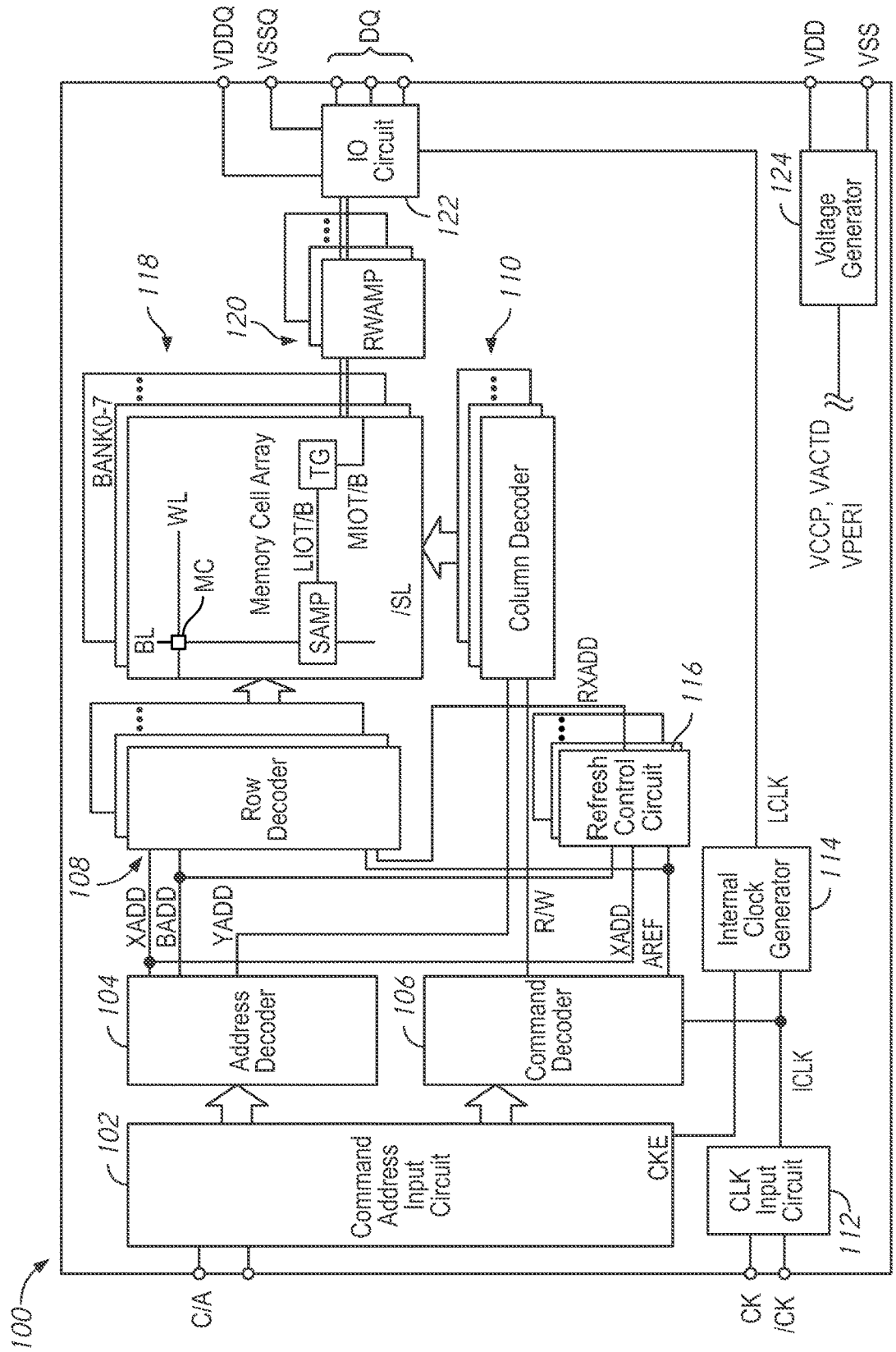
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

The row decoder may operate in different voltage domains. As used herein, different voltage domains may refer to the range of voltages that a given signal operates at. Since signals in a memory may generally be binary, a signal operating in a first voltage domain indicates a signal where a first voltage indicates a logical high, while a signal operating in a second voltage domain uses a second voltage to indicate a logical high. In some embodiments, different voltage domains may use a common voltage to represent a logical low (e.g., a ground voltage).

The row decoder may need to convert signals between different voltage domains. For example, the memory array may operate in a VCCP voltage domain, while the signals received by the row decoder may operate in a VPERI voltage domain, where VPERI is a lower voltage than VCCP. The row decoder may receive a row address and decode different sections of the row address to activate control signals. For example, the row address may be a multi-bit signal, and one set of bits may specify one of a particular set of sections, while another set of bits may specify a word line within that section. The portion of the row address which specifies the section may be referred to as a section address. The section address may be decoded into a pre-section enable signal in the VPERI domain, which may be used to generate a section enable signal in the VCCP domain. A section enable circuit may use the section enable signal to activate a word line driver signal MWL. The section enable circuit may use a voltage VACTD (which is between VCCP and VPERI) and a buffer transistor to couple between the VCCP and VPERI domains. It may be useful to reduce the size of the row decoder by removing the need for an extra buffer transistor.

The present disclosure is drawn to apparatuses, systems, and methods for a row decoder with multiple section enable signal voltage domains. A section enable signal driver receives a pre-section enable signal and provides a first section enable signal in a first voltage domain (e.g., VCCP) and a second section enable signal in a second voltage domain (e.g., VACTD). The pre-section enable signal may be in a third domain (e.g., VPERI). A word line driver signal is provided in the first voltage domain, with a level based on the first section enable signal and the second section enable signal. Since the section enable signal is divided into two, one of which is in an intermediate voltage domain, there may be no need for an additional buffer transistor between the transistors which receive the section enable signals and transistor(s) coupled to signals in a different voltage domain. This may help reduce the size of the row decoder.

For example, the first section enable signal may be coupled to a gate of a first transistor and the second section enable signal may be coupled to a second transistor. The first transistor may be a p-type transistor which couples the voltage VCCP to a signal line when the first section enable signal is a logical low, and the second transistor may be an n-type transistor which couples a ground voltage to the signal line when the second section enable signal is a logical high and when the second transistor is activated by decoded row address signals. A voltage along the signal line may be inverted to provide the multi-word line driver signal.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a refresh mode. In some embodiments, the refresh mode command may be externally issued to the memory device 100. In some embodiments, the refresh mode command may be periodically generated by a component of the device. In some embodiments, when an external signal indicates a refresh entry command, the refresh signal AREF may also be activated. The refresh signal AREF may be used to control the timing of refresh operations during the refresh mode. The signal AREF may be generated with periodic timing during the refresh mode. Thus, refresh operations may continue automatically. A refresh mode exit command (which may be from an external controller and/or may be internally generated) may cause the periodic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials such as VCCP, VPERI, VACTD and other internal voltages based on the power supply potentials VDD and VSS supplied to the power supply terminals. The different voltage potentials may be useful in different areas of the memory. For example, the voltage VCCP may be a higher voltage than VDD, and may be used to operate the memory cells of the memory array 118 and certain signals of the row decoder 108. The voltage VPERI may have a similar voltage as VDD, and may be useful for signals throughout the memory outside the array 118. The voltage VACTD may be an intermediate voltage (e.g., between VCCP and VPERI useful in the row decoder 108. The different voltages may be useful to establish different voltage domains. For example, each voltage may represent a high logical level in a corresponding voltage domain (e.g., VCCP represents a logical high in a VCCP domain, etc.). The voltage domains may share a common voltage which represents a logical low, such as VSS.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
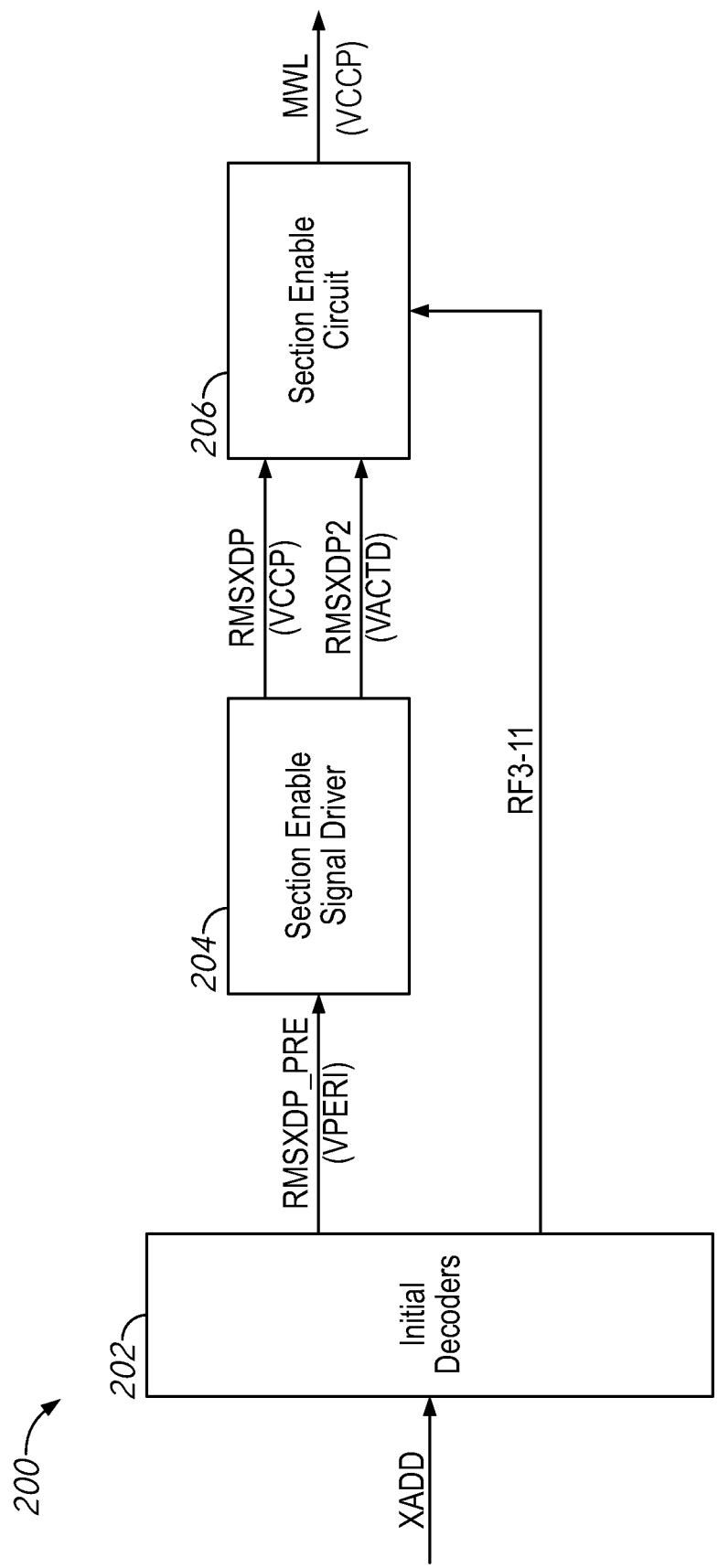
FIG. 2 is a block diagram of a portion of a row decoder according to some embodiments of the present disclosure.

FIG. 2 is a block diagram of a portion of a row decoder according to some embodiments of the present disclosure. The row decoder portion 200 may, in some embodiments, represent a portion of the row decoder 108 of FIG. 1. The row decoder portion 200 includes initial decoders 202 which receive the row address XADD and provide a pre-section enable signal RMSXDP_PRE which is in a VPERI voltage domain. The initial decoders 202 also provide other decoded signals based on the address XADD, here labelled RF3-11 (e.g., signals based on bits 3 to 11 of the original row address XADD). The row decoder portion 200 includes a section enable signal driver which receives RMSXDP_PRE and provides two row enable signals RMSXDP (in a VCCP voltage domain) and RMSXDP2 (in a VACTD voltage domain). A section enable circuit 206 receives RMSXDP and RMSXDP2 and provides a multi-word line driver signal MWL. The section enable circuit 206 may be activated by one or more of the decoded signals RF3-11.

The row decoder portion 200 includes a set of initial decoders 202, which represent components of the row decoder which are 'upstream' of the section enable signal driver 204. The initial decoders 202 receive the row address XADD, which may be a multi-bit signal. Different portions of the row address (e.g., different sets of bits) may indicate different levels of hierarchy within the organization of the memory array. For example, XADD<12:15> may represent a section address and may be used to generate the pre-section enable signal RMSXDP_PRE. Similarly, other portions of the row address XADD may activate other signals, here collectively referred to as RF3-11. There may be several individual signals within RF3-11 (as described in more detail herein) which may activate different levels of the decoder 200. For example, there may be multiple section enable circuits 206, and a combination of signals RF3-11 may activate one of the section enable circuits 206 as specified by the row address XADD.

The pre-section enable signal RMSXDP_PRE may be in a VPERI voltage domain, where the voltage VPERI represents a logical high (e.g., an active signal) and a ground voltage (e.g., VSS) represents a logical low (e.g., an inactive signal). While only a single RMSXDP_PRE signal is shown, there may be multiple RMSXDP_PRE signals, and the initial decoders 202 may choose which one(s) to activate (e.g., set to VPERI) based on the value of the row address XADD.

The section enable signal driver receives the signal RMSXDP_PRE and generates section enable signals RMSXDP and RMSXDP2, each of which is in a different voltage domain, and in a different voltage domain than RMSXDP_PRE. There may be a number of section enable drivers 204, each associated with a different RMSXDP_PRE signal, here only a single section enable signal driver 204 is shown. The signal RMSXDP is in a VCCP domain, where a voltage VCCP represents a logical high and a ground voltage (e.g., VSS) represents a logical low. The signal RMSXDP2 is in a VACTD domain, where a voltage VACTD represents a logical high and a ground voltage (e.g., VSS) represents a logical low. The voltages VPERI, VCCP, and VACTD may be different from each other. The voltage VCCP may be a voltage used in the memory array, and may be higher than the voltage VPERI, which is used in regions of the memory outside the memory array. The voltage VACTD may be an intermediate voltage between VCCP and VPERI. The signals RMSXDP and RMSXDP2 may have a same logical level. For example, if the signal RMSXDP is active (e.g., at VCCP) then the signal RMSXDP2 is also active (e.g., at VACTD). Similarly, if the signal RMSXDP is inactive (e.g., at VSS) then the signal RMSXDP is also inactive (e.g., at VSS).

The section enable signals RMSXDP and RMSXDP2 are provided to a section enable circuit 206. There may be several section enable circuits 206 each of which generates a different multi-word line driver signal MWL. The MWL signals in turn activate word line driver(s) which may activate word lines. One or more section enable circuits 206 may be activated by the decoded address signals RF3-11. When an active section enable circuit 206 receives section enable signals RMSXDP and RMSXDP2 which are active (e.g., both at a high logical level), that section enable circuit 206 provides its MWL signal at an active level.

Figure 3:
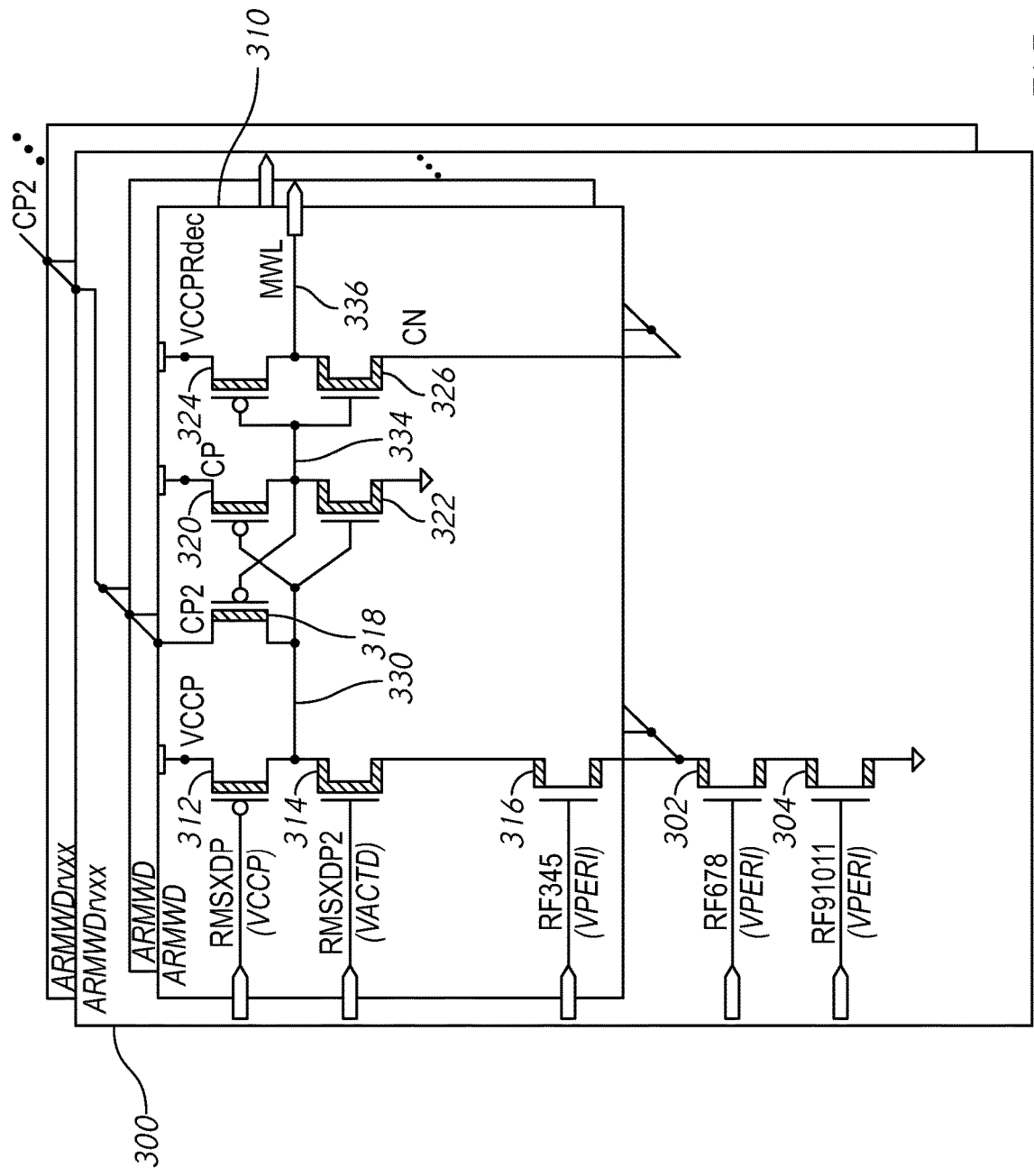
FIG. 3 is a schematic of a section enable circuit according to some embodiments of the present disclosure.

FIG. 3 is a schematic of a section enable circuit according to some embodiments of the present disclosure. The section enable circuit 300 may, in some embodiments be a part of row decoder 108 of FIG. 1 and/or may implement section enable circuit 206 of FIG. 2.

The section enable circuit 300 receives section enable signals RMSXDP and RMSXDP2 at an MWL generator circuit 310, which provides an MWL signal at an active level when the signals RMSXDP and RMSXDP2 are inactive and the MWL generator circuit 310 is active. The MWL generator circuit 310 is shown as a stacked box to represent that there are multiple MWL generator circuits 310, each of which may be activated to provide a respective MWL signal. The MWL generator circuit 310 may be activated by decoded address signals RF345, RF678, and RF91011 (e.g., RF3-11 of FIG. 2). While certain arrangements of signals (e.g., RF347, RF678, and RF91011) are discussed with respect to the present disclosure, these are examples only, and other signals and patterns of bits of the row address may be used in other example embodiments.

The signals RF345, RF678, and RF91011 are decoded address signals based on the decoded row address XADD. For example, one or more signals RF345 are activated by the $3^{rd}$, $4^{th}$, and $5^{th}$ bits of the row address. Similarly, RF678 may be active based on XADD<6:8> and RF91011 may be active based on XADD<9:11>. The signals RF678 and RF91011 specify multiple MWL generators 310, while the signal RF345 may specify a selected one of those specified MWL generators 310 to activate. For example, the section enable circuit 300 includes transistors 302 and 304. The transistor 302 has a drain coupled to multiple MWL generator circuits 310 and a source coupled to a drain of transistor 304, which has a source coupled to a ground voltage (e.g., VSS). The gate of transistor 302 is coupled to RF678 and the gate of transistor 304 is coupled to RF91011. The transistors 302 and 304 may be n-type transistors. Accordingly, when both the RF678 and RF91011 signals coupled to this MWL driver 310 are active, the MWL driver (along with any others activated by those values of RF678 and RF91011) are coupled to ground. The MWL generator circuit 310 includes a transistor 316 with a drain coupled to a source of transistor 314, a source coupled to the drain of transistor 302, and a gate coupled to RF345. The transistor 316 may be an n-type transistor. The signal RF345 may be specific to this MWL generator circuit 310. Accordingly, when RF345 (along with RF678 and RF91011) is active, the transistor 316 couples transistor 314 to ground, activating the MWL generator circuit 310. The signal RF345 may be provided with specified timing to control the activation of the MWL generator 310 as part of an access operation.

The MWL generator circuit 310 includes a transistor 312 with a source coupled to a voltage VCCP, a drain coupled to a node 330, and a gate coupled to RMSXDP. The transistor 312 may be a p-type transistor. The MWL generator circuit 310 also includes transistor 314 which has a drain coupled to node 330, a source coupled to a drain of transistor 316, and a gate coupled to RMSXDP2. The transistor 314 may be an n-type transistor. Accordingly, the transistors 312 and 314 may act somewhat analogously to an inverter circuit, with the node 330 as the output. However, the transistors 312 and 314 are coupled to separate inputs RMSXDP and RMSXDP2 which have different voltages when active, although since they share a logical level, both are active at the same time. This is because the gate voltage on transistor 316 (e.g., when RF345 is active) is VPERI, which is a lower voltage than VCCP (the gate voltage on transistor 312 when RMSXDP is active). The gate voltage of VACTD on transistor 314 (e.g., when RMSXDP2 is active) may act as an intermediate to improve reliability between the connection between signals in the VCCP domain (e.g., RMSXDP) and signals in the VPERI domain (e.g., RF345, RF678, and RF91011).

The node 330 carries a signal which is a logical inverse of RMSXDP and RMSXDP2. Similar to RMSXDP, the signal on the node 330 is in the VCCP domain. Transistors 320 and 322 act as inverters and provide a signal on node 334 which is the logical inverse of the signal on node 330 (e.g., the signal on node 334 matches the logical level of RMSXDP and RMSXDP2). Transistor 320 has a source coupled to a control signal CP, drain coupled to node 334, and gate coupled to node 330. The transistor 320 may be a p-type transistor. The transistor 322 has a source coupled to a ground voltage, a drain coupled to node 334, and a gate coupled to node 330. The transistor 322 may be an n-type transistor. Accordingly, when the signal CP is active, the transistors 320 and 322 may act as an inverter. The signal CP may be provided at an active level (e.g., VCCP) a time after RF345 becomes active to control the timing of the MWL generator 310.

A transistor 318 has a source coupled to a second control signal CP2, a drain coupled to the node 330, and a gate coupled to the node 334. The transistor 318 may be a p-type transistor. When the signal on node 334 is inactive (e.g., RMSXDP and RMSXDP2 are also inactive), the transistor 318 is active, and the voltage of control signal CP2 is coupled to the node 330. This may be used to drive the voltage on the node 330.

The signal on the node 334 is inverted by transistors 324 and 326 to provide an output voltage on the node 336 which acts as the MWL signal. The transistor 324 has a source coupled to VCCPRdec (which may be an internal VCCP voltage), a drain coupled to node 336, and a gate coupled to the node 334. The transistor 324 may be a p-type transistor. The transistor 326 has a source coupled to a control signal CN, a drain coupled to node 336, and a gate coupled to node 334. The transistor 326 may be an n-type transistor. The transistors 324 and 326 may act together as an inverter such that the signal MWL along node 336 has an inverted logical level from node 334 (e.g., the signal MWL is a logical inverse of RMSXDP and RMSXDP2). The signal CN may be a control signal used to manage the timing at which the signal MWL is provided.

In this manner, the transistor 314 which is activated to the section enable signal, has a node which is directly coupled (e.g., with no intervening transistor) to a node of transistor 316 which is activated by a signal (RF345) in a VPERI voltage domain. Since the transistor 314 is coupled to a section enable signal which is in a different, intermediate voltage domain between VCCP and VPERI, there may be increased reliability compared to if a transistor operated by VCCP had a node directly coupled to a node of a transistor operated by VPERI.

Figure 4:
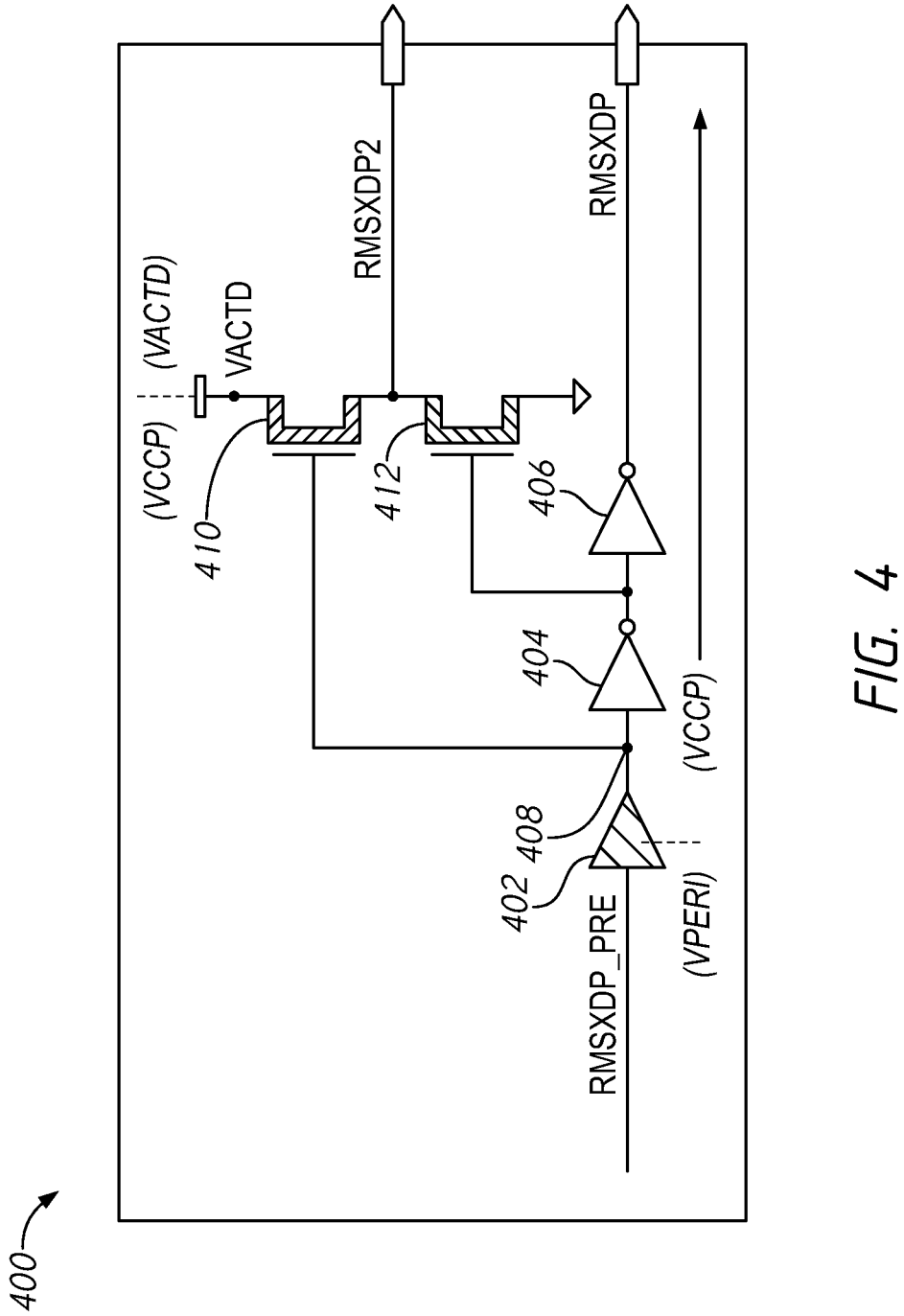
FIG. 4 is a schematic diagram of a section enable signal driver according to some embodiments of the present disclosure.

FIG. 4 is a schematic diagram of a section enable signal driver according to some embodiments of the present disclosure. The driver 400 may, in some embodiments be included in the row decoder 108 of FIG. 1 and/or an implementation of the driver 204 of FIG. 2. The driver 400 receives a pre-section enable signal RMSXDP_PRE and provides the signals RMSXDP and RMSXDP2. The driver 400 includes level shifter 402 which converts PRSXDP_PRE from a VPERI domain to a VCCP domain, Inverters 404 and 406 which provide RMSXDP, and transistors 410 and 412 which provide RMSXDP2.

Level shifter 402 has an input coupled to RMSXDP_PRE and an output coupled to a node 408. The level shifter 402 receives a signal (RMSXDP_PRE) in the VPERI voltage domain and provides a signal to the node 408 which has the same logical level as RMSXDP_PRE, but is in the VCCP domain. The node 408 is coupled to the input of an inverter 404, which has an output coupled to the input of inverter 406. Inverter 406 provides the signal RMSXDP. Since there are two inverters 404 and 406 in series between the node 508 and the signal RMSXDP, then the signal RMSXDP has the same logical level as the node 408 (e.g., the same level as RMSXDP_PRE). The inverters 404 and 406 may operate in the VCCP domain.

The driver 400 includes a transistor 410 with a source coupled to a voltage VACTD, a drain coupled to a node carrying RMSXDP2, and a gate coupled to the node 408 (e.g., RMSXDP_PRE but in the VCCP domain), and a transistor 412 with a source coupled to RMSXDP2, a drain coupled to a ground voltage (e.g., VSS), and a gate coupled to the signal provided by inverter 404 (e.g., the inverse of RMSXDP_PRE in the VCCP domain). The transistors 410 and 412 may both me n-type transistors. Accordingly, when RMSXCDP_PRE is active (e.g., at VPERI), then a voltage VCCP (due to the level shifter 402) is applied to the gate of transistor 410, coupling the voltage VACTD to RMSXDP2. When RMSXDP_PRE is inactive (e.g., at a ground voltage VSS), then a voltage of VCCP (due to inverter 404) is applied to the gate of transistor 412, coupling RMSXDP2 to a ground voltage (e.g., VSS).

Figure 5:
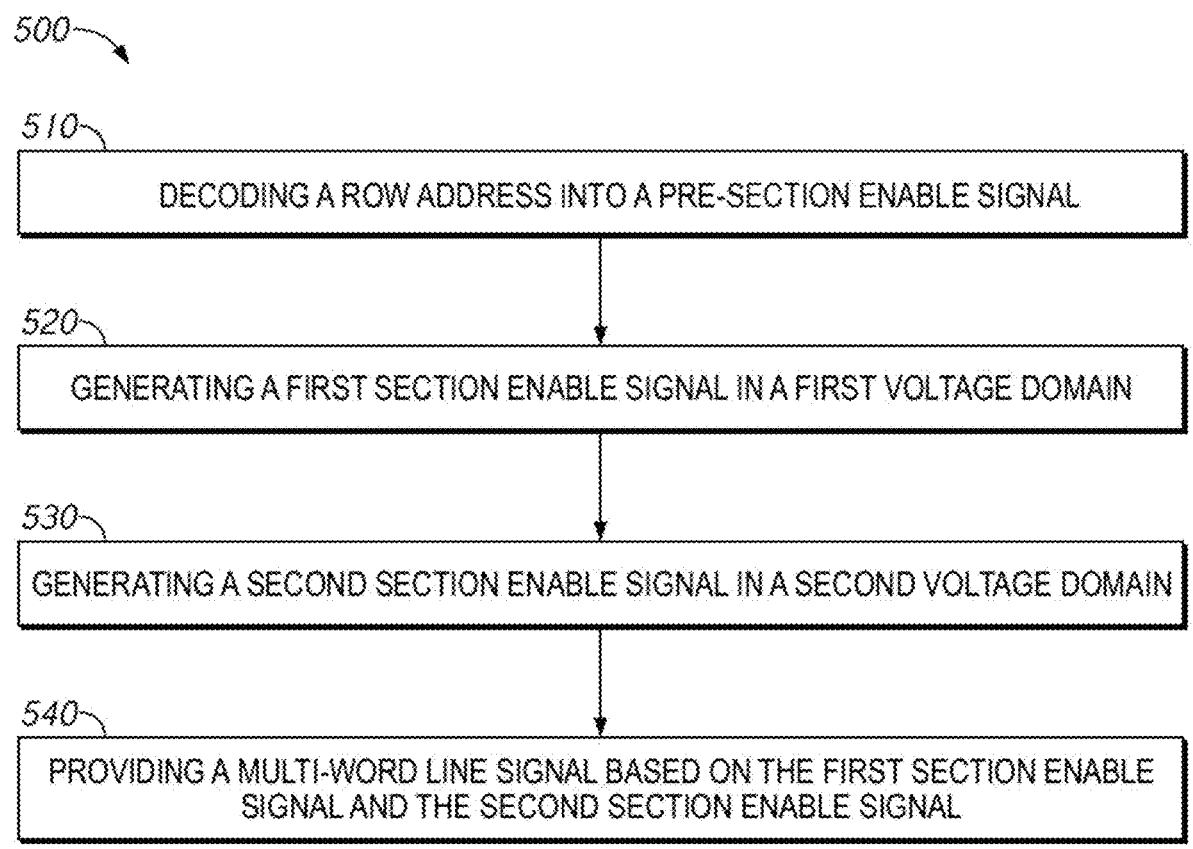
FIG. 5 is a flow chart of a method according to some embodiments of the present disclosure.

FIG. 5 is a flow chart of a method according to some embodiments of the present disclosure. The method 500 may, in some embodiments, be implemented by one or more of the apparatuses or systems described in FIGS. 1-4.

The method 500 includes box 510, which describes decoding a row address into a pre-section enable signal. The row address may be part of an access operation on a memory array (e.g., 118 of FIG. 1). The row address may have different portions which correspond to different levels of hierarchy in the memory array. The method 500 may include generating the pre-enable signal based on a section address portion of the row address.

The method 500 includes box 520, which describes generating a first section enable signal in a first voltage domain. The first section enable signal (e.g., RDMSXP) may use a first voltage (e.g., VCCP) to represent a logical high (e.g., an active first section enable signal) and a ground voltage (e.g., VSS) to represent a logical low (e.g., an inactive first section enable signal). The method 500 includes generating the active first section enable signal when the pre-enable signal is active and generating the inactive first section enable signal when the pre-enable signal is inactive.

The method includes box 530, which describes generating a second section enable signal in a second voltage domain. The second section enable signal (e.g., RDMSXP2) may use a second voltage (e.g., VACTD) to represent a logical high (e.g., an active second section enable signal) and a ground voltage (e.g., VSS) to represent a logical low (e.g., an inactive second section enable signal). The method 500 includes generating the active second section enable signal when the pre-enable signal is active and generating the inactive second section enable signal when the pre-enable signal is inactive.

The first and second section enable signals may be generated by a section enable signal driver circuit (e.g., 204 of FIG. 2). The pre-enable signal may be in a third voltage domain (e.g., a VPERI domain), where a third voltage (e.g., VPERI) represents the active pre-enable signal and the ground voltage (e.g., VSS) represents the inactive pre-enable signal. The voltage VACTD may be between the voltages VPERI and VCCP.

The method 500 includes box 540, which describes providing a multi-word line signal based on the first section enable signal and the second section enable signal. A section enable circuit (e.g., 206) may provide the multi-word line signal MWL. The method 500 may include providing the MWL signal at the inactive level when the first and the second section enable signals are active and providing the MWL signal at the active level when the first and the second section enable signals are inactive. The MWL signal may be in the first voltage domain (e.g., the VCCP domain).

The method 500 may include activating at least one word line (e.g., in memory array 118 of FIG. 1) responsive to the MWL signal. The method 500 may include decoding the row address into a decoded address signal (e.g., RF3-11 of FIG. 2), activating a selected section enable circuit responsive to the decoded address signal, and providing the multi-word line driver signal with the selected section enable circuit when the selected section enable circuit is active.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a section enable signal driver configured to receive a pre-section enable signal and provide a first section enable signal in a first voltage domain and a second section enable signal in a second voltage domain, wherein the pre-section enable signal is in a third voltage domain;
a section enable circuit configured to provide a multi-word line driver signal in the first voltage domain with a level based on the first section enable signal and the second section enable signal.

2. The apparatus of claim 1, wherein in the first voltage domain a logical high is represented by a first voltage, and wherein in the second voltage domain a logical high is represented by a second voltage different than the first voltage.

3. The apparatus of claim 1, wherein the second voltage domain is intermediate to the first and the third voltage domains.

4. The apparatus of claim 1, wherein the section enable circuit comprises:
a first transistor configured to couple a node to a voltage which represents a logical high in the first voltage domain when the first section enable signal is inactive:
a second transistor configured to couple a ground voltage which represents a logical low in the first voltage domain to the node when the second section signal is active, wherein the level of the multi-word line driver signal is based on a voltage of the node.

5. The apparatus of claim 1, wherein the section enable signal driver comprises:
a first transistor configured to couple a node to a voltage which represents a logical high in the second voltage domain when the pre-section enable signal is active;
an inverter configured to provide an inverted pre-section enable signal;
a second transistor configured to couple the node to a ground voltage which represents a logical low in the second voltage domain when the inverted pie-section enable signal is active.

6. The apparatus of claim 1, wherein the first enable signal and the second enable signal have a same logical level.

7. The apparatus of claim 1, wherein the decoded row address is a multi-bit row address and a set of bits within the multi-bit row address is decoded to provide the pre-section enable signal.

8. A method comprising:
decoding a row address into a pre-section enable signal; and
when the pre-section enable signal is at a first signal level:

generating a first section enable signal in a first voltage domain based on the pre-section enable signal; and generating a second section enable signal in a second voltage domain based on the pre-section enable signal; and providing from a section enable circuit, a multi-word line driver signal based on the first section enable signal and the second section enable signal, wherein the section enable circuit receives the first section enable signal and the second section enable signal concurrently, the first section enable signal having a voltage of the first voltage domain and the second section enable signal having a voltage of the second voltage domain.

9. The method of claim 8, wherein:

the first section enable signal is at a first voltage which represents a first signal level of the first section enable signal and the second section enable signal is at a second voltage which represents a first signal level of the second section enable signal when the pre-section enable signal is at a third voltage which represents the first signal level of the pre-section enable signal.

10. The method of claim 9, wherein the second voltage is between the first voltage and the third voltage.

11. The method of claim 9, further comprising:

providing the first section enable signal at a ground voltage which represents a second signal level of the first section enable signal and the second section enable signal at the ground voltage which represents a second signal level of the second section enable signal when the pre-section enable signal is at the ground voltage which represents a second signal level of the pie-section enable signal.

12. The method of claim 8, further comprising providing activating at least one word line responsive to the multi-word line driver signal.

13. The method of claim 8, further comprising:

decoding the row address into a decoded address signal;

activating a selected section enable circuit responsive to the decoded address signal;

providing the multi-word line driver signal with the selected section enable circuit when the selected section enable circuit is active.

14. The method of claim 8, further comprising:

coupling a node to a first voltage when the first section enable signal is inactive;

coupling the node to a ground voltage when the second section enable signal is active; and setting a level of the multi-word line driver signal based on the voltage of the node.

15. The apparatus of claim 5, wherein:

the inverter is a first inverter;

the section enable signal driver further comprises:

a level shifter configured to receive the pre-section enable signal in the thud voltage domain and provide the pre-section enable signal in the first voltage domain to the first inverter and to a gate of the first transistor; and a second inverter configured to receive the inverted pre-section enable signal in the first voltage domain and provide the first section enable signal in the first voltage domain; and the inverted pre-section enable signal in the first voltage domain is provided to a gate of the second transistor.

16. The apparatus of claim 1, wherein the pre-section enable signal is based on a portion of a decoded row address.

17. The apparatus of claim 16, wherein:

the portion of the decoded row address comprises a first portion of the decoded row address;

the section enable circuit is further configured to receive a second portion of the decoded row address; and the section enable circuit is activated by the second portion of the decoded row address.

18. An apparatus, comprising:

one or more decoders configured to decode a first portion of a received row address and provide a pre-section enable signal in first voltage domain;

a section enable signal driver configured to receive the pre-section enable signal and provide a first section enable signal in a second voltage domain and a second section enable signal in a third voltage domain;

a section enable circuit configured to receive the first section enable signal and the second section enable signal and provide a multi-word line driver signal in the second voltage domain.

19. The apparatus of claim 18, wherein the third voltage domain is intermediate to the first and the second voltage domains.

20. The apparatus of claim 18, wherein the pre-section enable signal, the first enable signal and the second enable signal have a same logical level.

* * * * *